(12) United States Patent
Woo et al.

(10) Patent No.: US 9,019,191 B2
(45) Date of Patent: Apr. 28, 2015

(54) STAGE CIRCUIT AND EMISSION CONTROL DRIVER USING THE SAME

(71) Applicant: Samsung Display Co., Ltd., Yongin, Gyeonggi-Do (KR)

(72) Inventors: Min-Kyu Woo, Yongin (KR); Dong-Hwi Kim, Yongin (KR); Hwa-Young Song, Yongin (KR); Ji-Hye Kim, Yongin (KR)

(73) Assignee: Samsung Display Co., Ltd., Gyeonggi-Do (KR)

(*) Notice: Subject to any disclaimer, the term of this patent is extended or adjusted under 35 U.S.C. 154(b) by 357 days.

(21) Appl. No.: 13/711,952

(22) Filed: Dec. 12, 2012

(65) Prior Publication Data
US 2013/0328495 A1  Dec. 12, 2013

(30) Foreign Application Priority Data
Jun. 8, 2012  (KR) .................... 10-2012-0061491

(51) Int. Cl.
*G09G 3/36* (2006.01)
*H05B 37/02* (2006.01)
*G09G 3/32* (2006.01)

(52) U.S. Cl.
CPC .............. *H05B 37/02* (2013.01); *G09G 3/3266* (2013.01); *G09G 2300/0861* (2013.01); *G09G 2330/021* (2013.01)

(58) Field of Classification Search
CPC . G09G 3/3688; G09G 3/3677; G09G 3/3648; G09G 2310/027; G11C 19/28
USPC ................ 345/76, 100, 204; 377/64; 315/224
See application file for complete search history.

(56) References Cited

U.S. PATENT DOCUMENTS

| | | | | |
|---|---|---|---|---|
| 8,451,259 B2* | 5/2013 | Kim | ............................. | 345/206 |
| 2011/0080393 A1 | 4/2011 | Kim et al. | | |
| 2011/0273407 A1 | 11/2011 | Chung et al. | | |
| 2012/0062545 A1* | 3/2012 | Kim | ............................. | 345/212 |
| 2012/0327131 A1* | 12/2012 | Jang | ............................. | 345/690 |

FOREIGN PATENT DOCUMENTS

| KR | 10-1056213 B1 | 8/2011 |
|---|---|---|
| KR | 10-1146990 B1 | 5/2012 |

* cited by examiner

*Primary Examiner* — Quan Tra
(74) *Attorney, Agent, or Firm* — Knobbe Martens Olson & Bear LLP

(57) ABSTRACT

A stage circuit including an output unit for supplying first or second power source to an output terminal is disclosed. The stage circuit may comprise a bidirectional driver for respectively supplying signals supplied to first and second input terminals, a first driver, and a second driver. The second driver controls the output unit to output the second power source to the output terminal without any voltage loss, corresponding to a second clock signal.

22 Claims, 8 Drawing Sheets

STAGE CIRCUIT AND EMISSION CONTROL DRIVER USING THE SAME

CROSS-REFERENCE TO RELATED PATENT APPLICATION

This application claims priority to and the benefit of Korean Patent Application No. 10-2012-0061491, filed on Jun. 8, 2012, in the Korean Intellectual Property Office, the entire content of which is incorporated herein by reference.

BACKGROUND

1. Field

The present technical field relates to a stage circuit and an emission control driver using the same, and more particularly, to a stage circuit and an emission control driver using the same for supplying emission control signals.

2. Description of the Related Technology

Recently, there have been developed various types of flat panel display devices capable of reducing the weight and volume of cathode ray tubes. The flat panel display devices include a liquid crystal display, a field emission display, a plasma display panel, an organic light emitting diode display device, and the like.

Among these flat panel display devices, the organic light emitting diode display displays images using organic light emitting diodes that emit light through recombination of electrons and holes. The organic light emitting diode display has a fast response speed and is driven with low power consumption. Generally, in an organic light emitting diode display, current corresponding to a data signal is supplied to an organic light emitting diode using a transistor formed in each pixel, so that the organic light emitting diode emits light.

Generally, a organic light emitting diode display includes a data driver for supplying a data signal to data lines, a scan driver for sequentially supplying a scan signal to scan lines, an emission control driver for supplying an emission control signal to emission control lines, and a pixel unit having a plurality of pixels coupled to the data lines, the scan lines and the emission control lines.

When a scan signal is supplied to a scan line, pixels included in the pixel unit are selected to receive a data signal supplied from a data line. The pixels that receive the data signal generate light with a predetermined luminance corresponding to the data signal, thereby displaying a predetermined image. The emission time of the pixels is controlled by an emission control signal supplied from an emission control line. Generally, the emission control signal sets the pixels to which the data signal is supplied to be in a non-emission state while being supplied to overlap with the scan signal supplied to one or two scan lines.

To this end, the emission driver includes stages respectively coupled to the emission control lines. The stages receive four or more clock signals and output a high or low voltage to an output line.

The emission control driver driven by four or more clock signals occupies a wide mounting area due to a plurality of transistors, a plurality of capacitors, signal lines, and the like. Where the emission control driver is configured with a PMOS transistor, a low voltage with high amplitude is output by the threshold voltage of the transistor, or the like, and accordingly, power consumption increases.

SUMMARY OF CERTAIN INVENTIVE ASPECTS

Embodiments provide a stage circuit and an emission control driver using the same for minimizing a mounting area and reducing power consumption.

In some embodiments, a stage circuit comprises an output unit configured to supply a first or second power source to an output terminal corresponding to a voltage applied to a first and a second node; a bidirectional driver configured to supply signals to a fifth and a sixth node via either a first and a second input terminal or a seventh and sixth input terminal a first driver configured to control the coupling between the fifth and second nodes and the coupling between the sixth and first nodes, according to a first clock signal supplied to a third input terminal; and a second driver coupled between the first driver and the output unit configured to output a sampling signal to a third node, according to a voltage supplied from a fourth node, wherein the second driver is configured to control the output unit to output the second power to the output terminal without any voltage loss, according to a second clock signal supplied to a fourth input terminal.

In some embodiments, the stage circuit comprises a first transistor coupled between the first power source and the output terminal, having a gate electrode coupled to the first node; and a second transistor coupled between the output terminal and the second power source, having a gate electrode coupled to the second node.

In some embodiments, the stage circuit comprises a third transistor coupled between the first power source and the third node, having a gate electrode coupled to the output terminal; a fourth transistor coupled between the third node and the second power, having a gate electrode coupled to the fourth node; a fifth transistor coupled between the first power and the second node, having a gate electrode coupled to the first node; a sixth transistor coupled between the first power and the fourth node, having a gate electrode coupled to the fifth node; a first capacitor coupled between the first node and the first power source; a second capacitor coupled between the second node and the fourth input terminal; and a third capacitor coupled between the fourth node and the fourth input terminal.

In some embodiments, each of the fifth and sixth transistors is formed by coupling a plurality of transistors in series.

In some embodiments, the first driver comprises: a seventh transistor coupled between the fifth node and the second node, having a gate electrode coupled to the third input terminal; an eighth transistor coupled between the sixth node and the first node, having a gate electrode coupled to the third input terminal; and a ninth transistor coupled between the sixth node and the fourth node, having a gate electrode coupled to the third input terminal.

In some embodiments, the bidirectional driver comprises a tenth transistor coupled between the first input terminal and the fifth node, configured to be turned on when a first control signal is supplied; an eleventh transistor coupled between the seventh input terminal and the fifth node, configured to be turned on when a second control signal is supplied; a twelfth transistor coupled between the second input terminal and the sixth node, configured to be turned on when the first control signal is supplied; and a thirteenth transistor coupled between the sixth input terminal and the sixth node, configured to be turned on when the second control signal is supplied.

In some embodiments, The stage circuit comprises a fourteenth transistor coupled between the sixth node and a fifth input terminal, having a gate electrode coupled to the fifth input terminal.

According to some embodiments disclosed herein, an emission control driver comprises a plurality of stage circuits respectively coupled to a plurality of emission control lines, wherein each of the plurality of stage circuits comprises an output unit configured to supply a first or a second power source to an output terminal, according to a voltage at a first and a second node respectively; a bidirectional driver configured to supply signals supplied to a fifth and a sixth node via either a first and a second input terminal or a seventh and a sixth input terminal respectively; a first driver configured to control the coupling between the fifth and second nodes and the coupling between the sixth and first nodes, according to a first clock signal supplied to a third input terminal; and a second driver coupled between the second driver and the output unit configured to output a sampling signal to a third node, corresponding to a voltage supplied from a fourth node; and wherein the second driver is configured to control the output unit to output the second power source to the output terminal without any voltage loss, according to a second clock signal supplied to a fourth input terminal.

In some embodiments, the third and fourth input terminals of a k-th stage are configured to receive the first and second clock signals, respectively, and the third and fourth input terminals of a (k+1)-th stage are configured to receive the second and first clock signals, respectively.

In some embodiments, the first and second clock signals have the same period, and are non-overlapping.

In some embodiments, the first input terminal is configured to receive a first start signal or an emission control signal of a previous stage, the second input terminal is configured to receive a second start signal or a sampling signal of the previous stage, the sixth input terminal is configured to receive a sampling signal of a next stage or the second start signal, and the seventh input terminal is configured to receive an emission control signal of the next stage or the first start signal.

In some embodiments, the first and second input terminals of a first stage of the plurality of stages receive the first and second start signals, respectively.

In some embodiments, the sixth and seventh input terminals of the last stage of the plurality of stages receive the second and first start signals, respectively.

In some embodiments, the first and second start signals have the same width, and have opposite phases.

In some embodiments, the output unit comprises: a first transistor coupled between the first power and the output terminal, having a gate electrode coupled to the first node; and a second transistor coupled between the output terminal and the second power, having a gate electrode coupled to the second node.

In some embodiments, the first driver comprises a third transistor coupled between the first power source and the third node, having a gate electrode coupled to the output terminal; a fourth transistor coupled between the third node and the second power source, having a gate electrode coupled to the fourth node; a fifth transistor coupled between the first power source and the second node, having a gate electrode coupled to the first node; a sixth transistor coupled between the first power source and the fourth node, having a gate electrode coupled to the fifth node; a first capacitor coupled between the first node and the first power source; a second capacitor coupled between the second node and the fourth input terminal; and a third capacitor coupled between the fourth node and the fourth input terminal.

In some embodiments, each of the fifth and sixth transistors is formed by coupling a plurality of transistors in series.

In some embodiments, the second driver comprises a seventh transistor coupled between the fifth node and the second node, having a gate electrode coupled to the third input terminal; an eighth transistor coupled between the sixth node and the first node, having a gate electrode coupled to the third input terminal; and a ninth transistor coupled between the sixth node and the fourth node, having a gate electrode coupled to the third input terminal.

In some embodiments, the bidirectional driver comprises a tenth transistor coupled between the first input terminal and the fifth node, configured to be turned on when a first control signal is supplied; an eleventh transistor coupled between the seventh input terminal and the fifth node, configured to be turned on when a second control signal is supplied; a twelfth transistor coupled between the second input terminal and the sixth node, configured to be turned on when the first control signal is supplied; and a thirteenth transistor coupled between the sixth input terminal and the sixth node, configured to be turned on when the second control signal is supplied.

In some embodiments, the emission control signal is sequentially supplied to the plurality of emission control lines in a first direction when the first control signal is supplied, and the emission control signal is sequentially supplied to the plurality of emission control lines in a second direction when the second control signal is supplied.

In some embodiments, the emission control driver further comprises a fourteenth transistor coupled between the sixth node and a fifth input terminal, having a gate electrode coupled to the fifth input terminal.

In some embodiments, the fifth input terminal is configured to receives a reset signal such that the emission control signal is simultaneously supplied to each of the plurality of emission control lines.

In the stage circuit and the emission control driver according to some embodiments, a stage circuit is driven by two clock signals, and accordingly, the structure of the stage circuit can be simply maintained. That is, the stage circuit as described herein has a mounting area decreased as compared with the conventional stage circuit, so that it is possible to minimize a dead space. Further, a low voltage with low amplitude can be output to the output terminal, and accordingly, it is possible to minimize power consumption.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
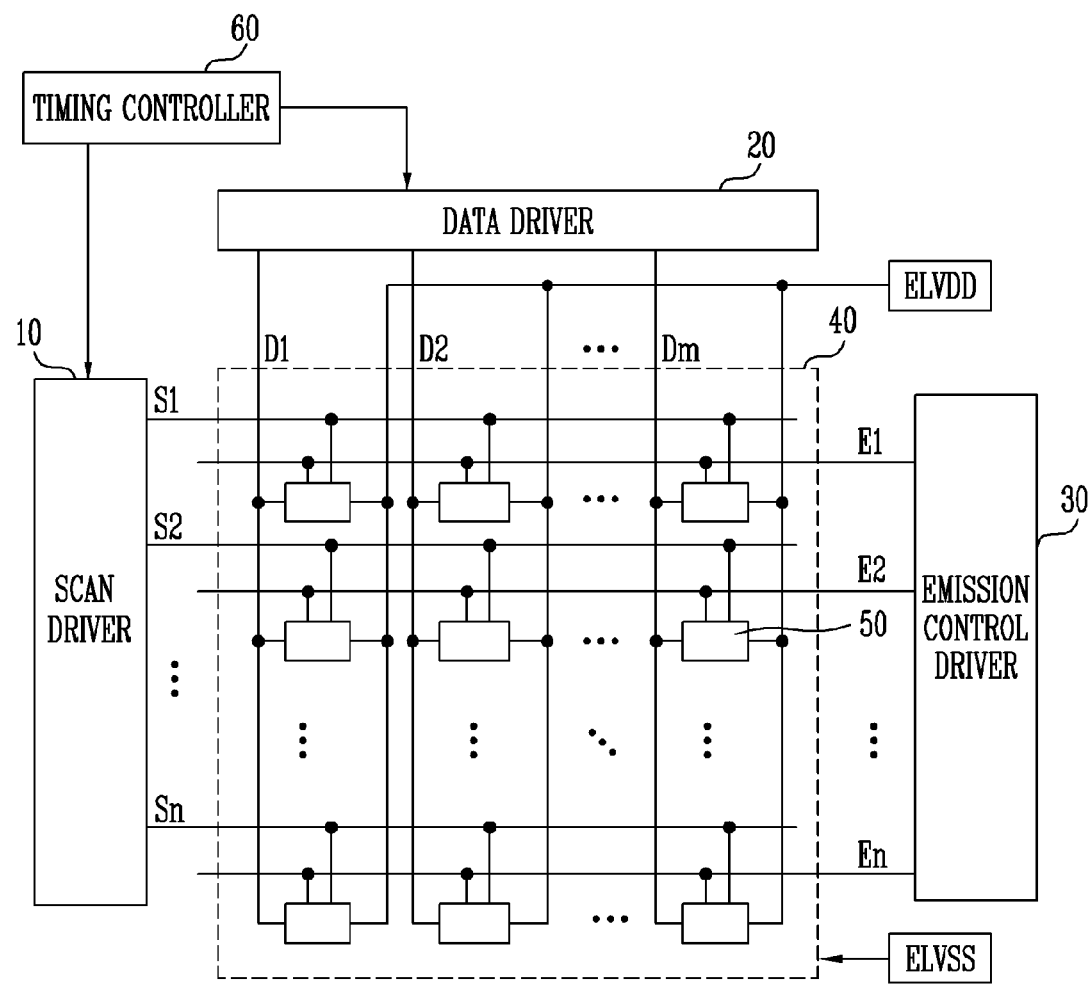
FIG. 1 is a diagram illustrating an organic light emitting diode display device.

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via a third element. Further, some of the elements that are not essential to the complete understanding of the invention are omitted for clarity. Also, like reference numerals refer to like elements throughout.

FIG. 1 is a diagram illustrating an organic light emitting diode display device.

Referring to FIG. 1, the organic light emitting diode display according to this embodiment includes a pixel unit 40 having pixels 50 positioned at intersection portions of scan lines S1 to Sn, data lines D1 to Dm and emission control lines E1 to En; a scan driver 10 for driving the scan lines S1 to Sn; a data driver 20 for driving the data lines D1 to Dm; an emission control driver 30 for driving the emission control lines E1 to En; and a timing controller 60 for controlling the drivers 10, 20 and 30.

The scan driver 10 supplies a scan signal to the scan lines S1 to Sn. If the scan signal is supplied to the scan lines S1 to Sn, pixels 50 are selected for each horizontal line.

The data driver 20 supplies a data signal to the data lines D1 to Dm in synchronization with the scan signal. The data signal supplied to the data lines D1 to Dm is supplied to the pixels 50 selected by the scan signal.

The emission control driver 30 sequentially supplies an emission control signal to the emission control lines E1 to En. Here, the emission driver 30 supplies the emission control signal so that the pixels 50 are set to be in a non-emission state during a period in which the data signal is supplied. To this end, the emission control signal supplied to an nth emission control line En is overlapped with the scan signal supplied to an nth scan line Sn.

The emission control driver 30 may sequentially supply the emission control signal from the first emission control line E1 to the n-th emission control line En or may sequentially supply the emission control signal from the n-th emission control line En to the first emission control line E1, as directed by the emission control driver 30. The emission control driver 30 may control the width of the emission control signal, the number of emission control signals supplied in one frame period, and the like, corresponding to the driving method of the emission control driver 30.

Figure 2:
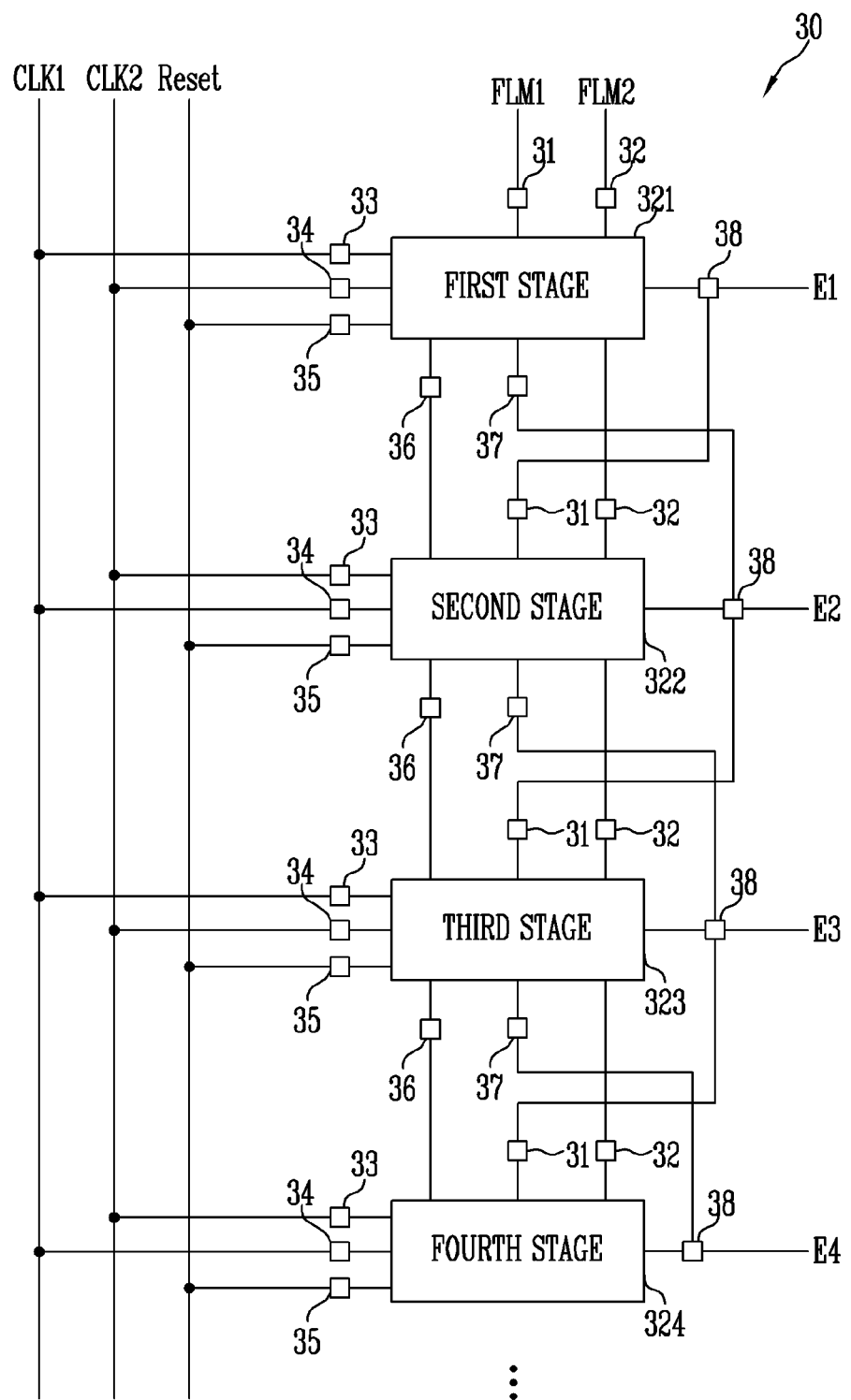
FIG. 2 is a diagram illustrating an embodiment of stages of an emission control driver shown in FIG. 1.

FIG. 2 is a diagram illustrating an embodiment of stages of an emission control driver shown in FIG. 1. For convenience of illustration, only four stages are shown in FIG. 2. A person of skill in the art would understand that an emission control driver may comprise less than or more than four stages.

Referring to FIG. 2, the emission control driver 30 according to this embodiment includes n stages 321, 322, 323, 324, ... respectively coupled to n emission control lines E1 to En. Each of the stages 321, 322, ... supplies an emission control signal to an emission control line (any one of E1 to En) coupled thereto.

To this end, each of the stages 321, 322, ... includes a first input terminal 31, a second input terminal 32, a third input terminal 33, a fourth input terminal 34, a fifth input terminal 35, a sixth input terminal 36, a seventh input terminal 37 and an output terminal 38.

The third and fourth input terminals 33 and 34 are included in a k-th (wherein k is an odd or even number) stage 32k receive first and second clock signals CLK1 and CLK2, respectively. The third and fourth input terminals 33 and 34 included in a (k+1)-th stage 32k+1 receive the second and first clock signals CLK2 and CLK1, respectively.

The first input terminal 31 included in each of the stages 321, 322, ... receives an emission control signal of a previous stage, and the second input terminal included in each of the stages 321, 322, ... receives a sampling signal of the previous stage. Here, the first and second input terminals 31 and 32 of the first stage 321 receive first and second start signals FLM1 and FLM2, respectively. Meanwhile, the first and second start signals FLM1 and FLM2 have the same width, and are set as signals reversed to each other. Similarly, the emission control signal and sampling signal output in the same stage have the same width, and are set as signals reversed to each other.

The fifth input terminal 35 included in each of the stages 321, 322, ... receives a reset signal, and the sixth input terminal 36 included in each of the stages 321, 322, ... receives a sampling signal of a next stage. The seventh input terminal 37 included in each of the stages 321, 322, ... receives an emission control signal of the next stage. Here, the sixth and seventh input terminals 36 and 37 of the first stage 321 receive the second and first start signals FLM2 and FLM1. The output terminal 38 included in each of the stages 321, 322, ... is coupled to an emission control line (any one of E1 to En) so as to supply an emission control signal to the emission control line (any one of E1 to En).

The stages 321, 322, ... are configured as the same circuit, and sequentially output an emission control signal in a first direction (e.g., from the first emission control line E1 to the n-th emission control line En) or a second direction (e.g., from the n-th emission control line En to the first emission control line E1). In a case where the emission control signal is supplied in the first direction, each of the stages 321, 322, ... is driven by the signals respectively supplied to the first and second input terminals 31 and 32. In a case where the emission control signal is supplied in the second direction, each of the stages 321, 322, ... is driven by the signals respectively supplied to the sixth and seventh input terminals 36 and 37. In the stages 321, 322, ..., the width of the emission control signal is controlled corresponding to the width of each of the first and second start signals FLM1 and FLM2.

Figure 3:
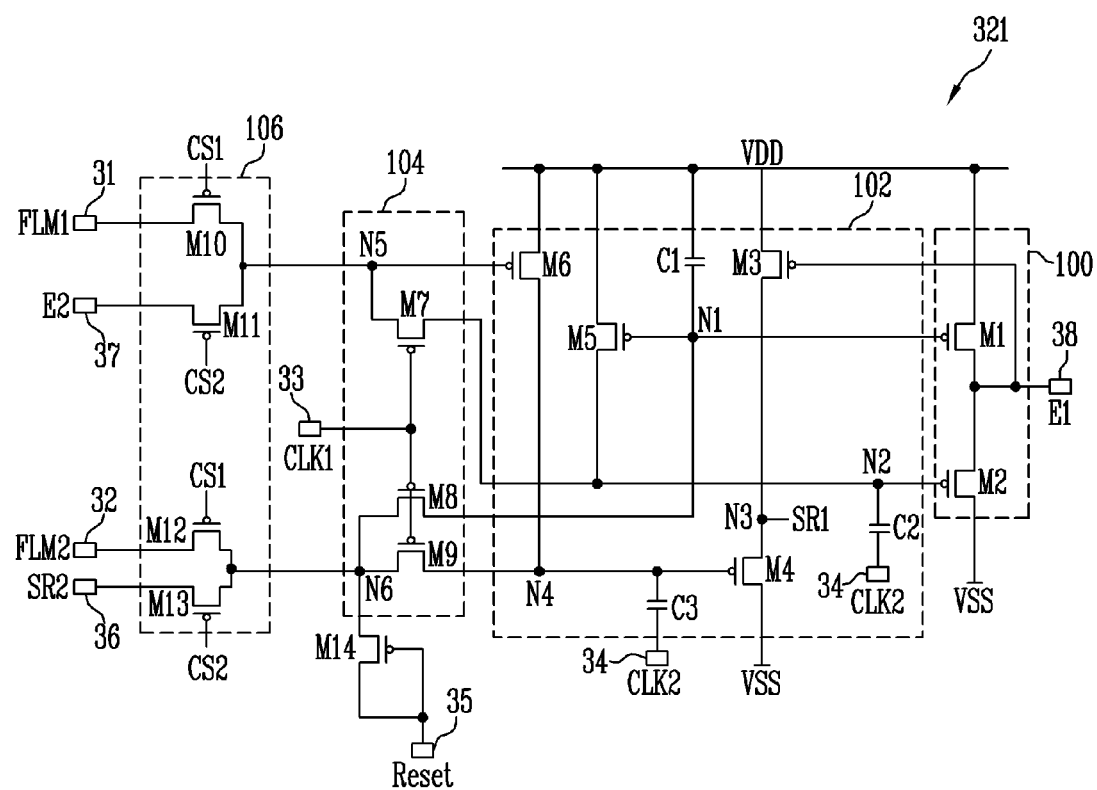
FIG. 3 is a circuit diagram illustrating a first embodiment of a stage shown in FIG. 2.

FIG. 3 is a circuit diagram illustrating a first embodiment of the stage shown in FIG. 2. For convenience of illustration, the first stage 321 is shown in FIG. 3. Additionally, although it has been illustrated in FIG. 3 that transistors are formed with PMOS transistors, the present embodiments are not limited thereto.

Referring to FIG. 3, the stage 321 according to the first embodiment includes an output unit 100, a first driver 104, a second driver 102 and a bidirectional driver 106.

The output unit 100 outputs a first power source VDD or second power source VSS, which is set to a voltage lower than that of the first power source VDD, to the output terminal 38, corresponding to a voltage applied to a first node N1 and a second node N2. To this end, the output unit 100 includes a first transistor M1 and a second transistor M2.

The first transistor M1 is coupled between the first power source VDD and the output terminal 38, and a gate electrode of the first transistor M1 is coupled to a first node N1. The first transistor M1 supplies the voltage of the first power to the output terminal 38, corresponding to the voltage of the first node N1. The voltage (i.e., high voltage) of the first power source VDD supplied to the output terminal 38 is supplied as an emission control signal to the emission control line E1.

The second transistor M2 is coupled between the output terminal 38 and the second power source VSS, and a gate electrode of the second transistor M2 is coupled to a second node N2. The second transistor M2 supplies the voltage of the second power source VSS to the output terminal 38, corresponding to the voltage of the second node N2. In this case, the voltage (i.e., low voltage) of the second power source VSS is supplied to the emission control line E1 so that the supply of the emission control signal is stopped.

The second driver 102 controls the output unit 100 to output the second power source VSS without any voltage loss, corresponding to the clock signal CLK2 supplied to the fourth input terminal 34. The second driver 102 outputs a sampling signal SR1, corresponding to the voltage supplied from the first driver 102. To accomplish this, the second driver 102 includes a third transistor M3, a fourth transistor M4, a fifth transistor M5, a sixth transistor M6, a first capacitor C1, a second capacitor C2 and a third capacitor C3.

The third transistor M3 is coupled between the first power source VDD and a third node N3, and a gate electrode of the third transistor M3 is coupled to the output terminal 38. The third transistor M3 supplies the voltage of the first power source VDD to the third node N3, corresponding to the voltage of the output terminal 38. Here, the third node N3 is used as a terminal through which the sampling signal SR1 is output.

The fourth transistor M4 is coupled between the third node N3 and the second power source VSS, and a gate electrode of the fourth transistor M4 is coupled to a fourth node N4. The fourth transistor M4 supplies the voltage of the second power source VSS, corresponding to the voltage of the fourth node N4.

The fifth transistor M5 is coupled between the first power source VDD and the second node N2, and a gate electrode of the fifth transistor M5 is coupled to the first node N1. The fifth transistor M5 supplies the voltage of the first power source VDD to the second node N2, when the gate signal is applied according to the voltage of the first node N1.

The sixth transistor M6 is coupled between the first power source VDD and the fourth node N4, and a gate electrode of the sixth transistor M6 is coupled to a fifth node N5. The sixth transistor M6 supplies the voltage of the first power source VDD to the fourth node N4, when the gate signal is applied according to the voltage of the fifth node N5.

The first capacitor C1 is coupled between the first power source VDD and the first node N1. The first capacitor C1 charges the voltage of the first node N1.

The second capacitor C2 is coupled between the fourth input terminal 34 and the second node N2. The second capacitor C2 controls the voltage of the second node N2, corresponding to the second clock signal CLK2 supplied to the fourth input terminal 34. Practically, the second capacitor C2 controls the voltage of the second node N2 so that a low voltage, corresponding to second power source VSS, is supplied to the output terminal 38, according to the second clock signal CLK2.

The third capacitor C3 is coupled between the fourth input terminal 34 and the fourth node N4. The third capacitor C3 controls the voltage of the fourth node N4, corresponding to the second clock signal CLK2 supplied to the fourth input terminal 34. Practically, the third capacitor C3 controls the voltage of the fourth node N4 so that a sufficiently low voltage is supplied to the third node N3, corresponding to the second clock signal CLK2.

The first driver 102 provides the second driver 102 with a voltage supplied from the bidirectional driver 106, corresponding to the first clock signal CLK1. To this end, the first driver 102 includes a seventh transistor M7, an eighth transistor M8 and a ninth transistor M9.

The seventh transistor M7 is coupled between the fifth node N5 and the second node N2, and a gate electrode of the seventh transistor M7 is coupled to the third input terminal 33. The seventh transistor M7 controls the coupling between the fifth node N5 and the second node N2, corresponding to the first clock signal CLK1, supplied to the third input terminal 33.

The eighth transistor M8 is coupled between a sixth node N6 and the first node N1, and a gate electrode of the eighth transistor M8 is coupled to the third input terminal 33. The eighth transistor M8 controls the coupling between the sixth node N6 and the first node N1, corresponding to the first clock signal CLK1 supplied to the third input terminal 33.

The ninth transistor M9 is coupled between the sixth node N6 and the fourth node N4, and a gate electrode of the ninth transistor M9 is coupled to the third input terminal 33. The ninth transistor M9 controls the coupling between the sixth node N6 and the fourth node N4, corresponding to the first clock signal CLK1 supplied to the third input terminal 33.

The bidirectional driver 106 allows the first and second input terminals 31 and 32 or the seventh and sixth input terminals 37 and 36 to be coupled thereto, corresponding to the first and second control signals CS1 and CS2.

The bidirectional driver 106 allows the first start signal FLM1 to be supplied to the first input terminal 31 or an emission control signal E2 of the next stage, supplied to the seventh input terminal 37, to be supplied thereto, according to the first and second control signals CS1 and CS2. The bidirectional driver 106 allows the second start signal FLM2 supplied to the second input terminal 32 or a sampling pulse SR2 supplied to the sixth input terminal 36 to be supplied thereto, according to the first and second control signals CS1 and CS2. To this end, the bidirectional driver 102 includes a tenth transistor M10, an eleventh transistor M11, a twelfth transistor M12 and a thirteenth transistor M13.

The tenth transistor M10 is coupled between the first input terminal 31 and the fifth node N5, and a gate electrode of the tenth transistor M10 receives the first control signal CS1. The tenth transistor M10 controls the coupling between the first input terminal 31 and the fifth node N5, corresponding to the first control signal CS1.

The eleventh transistor M11 is coupled between the seventh input terminal 37 and the fifth node N5, and a gate electrode of the eleventh transistor M11 receives the second control signal CS2. The eleventh transistor M11 controls the coupling between the seventh input terminal 37 and the fifth node N5, corresponding to the second control signal CS2.

The twelfth transistor M12 is coupled between the second input terminal 32 and the sixth node N6, and a gate electrode of the twelfth transistor M12 receives the first control signal CS1. The twelfth transistor M12 controls the coupling between the second input terminal 32 and the sixth node N6, corresponding to the first control signal CS1.

The thirteenth transistor M13 is coupled between the sixth input terminal 36 and the sixth node N6, and a gate electrode of the thirteenth transistor M13 receives the second control signal CS2. The thirteenth transistor M13 controls the coupling between the sixth input terminal 36 and the sixth node N6, corresponding to the second control signal CS2.

Meanwhile, in a case where the emission control signal is supplied in the first direction, the first control signal CS1 is supplied so that the tenth and twelfth transistors M10 and M12 are turned on. Then, the start signals FLM1 and FLM2 (or the emission control signal and sampling signal of the previous stage) are supplied to the first driver 102 so that the emission control signal can be sequentially supplied in the first direction. In a case where the emission control signal is supplied in the second direction, the second control signal CS2 is supplied so that the eleventh and thirteenth transistors M11 and M13 are turned on. Then, the emission control signal E2 and sampling signal SR2 of the next stage are supplied to the first driver 102 so that the emission control signal can be sequentially supplied in the second direction.

The stage circuit 321 according to this embodiment further includes a fourteenth transistor M14 coupled between the sixth node N6 and the fifth input terminal 35. A gate electrode of the fourteenth transistor M14 is coupled to the fifth input terminal 35. The fourteenth transistor M14 sets the voltage of the sixth node N6 to a low voltage, corresponding to a reset signal Reset. Here, the low voltage supplied to the sixth node N6 is supplied to the first node N1 via the eighth transistor M8 during a period in which the Reset signal is supplied. Then, the first transistor M1 is turned on so that the voltage of the first power source VDD is supplied to the output terminal 38.

Meanwhile, since the Reset signal is commonly supplied to all the stages 321, 322, . . . , the first power source VDD is supplied to the emission control lines E1 to En during the period in which the Reset signal is supplied. The Reset signal is supplied during an initial period in which power is supplied, or the like so that it is possible to prevent the occurrence of unnecessary emission, malfunction or the like.

Figure 4:
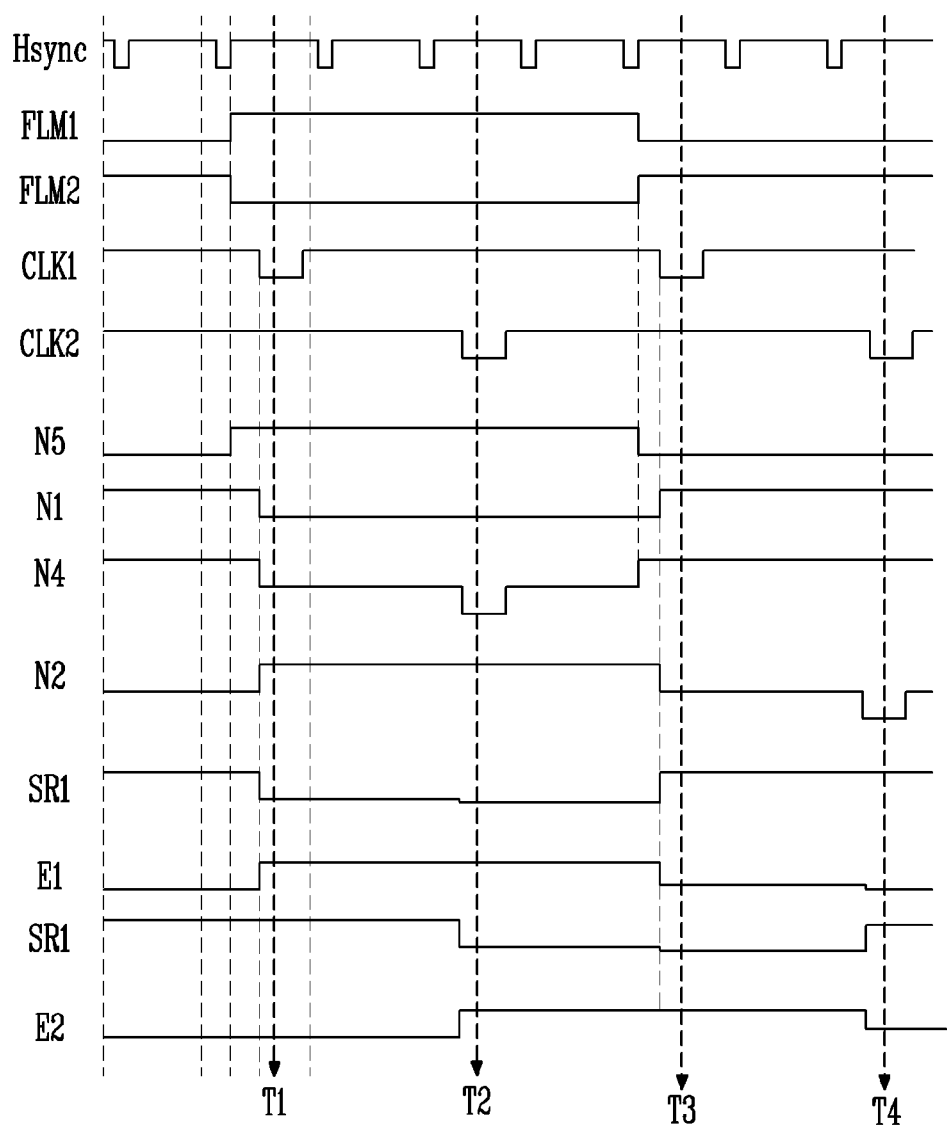
FIG. 4 is a waveform diagram illustrating an embodiment of a driving method of the stage.

FIG. 4 is a waveform diagram illustrating an embodiment of a driving method of the stage. For convenience of illustration, it is assumed in FIG. 4 that the first control signal CS1 is supplied so that the emission control signal is supplied in the first direction.

Referring to FIG. 4, the first and second clock signals CLK1 and CLK2 have the same period, and are supplied in different horizontal periods from each other, or, in other words, the period of the first and second clock signals are non-overlapping. The first and second start signals FLM1 and FLM2 have the same width, and are supplied with opposite phases to each other. Here, the first and second start signals FLM1 and FLM2 are supplied to overlap with the first and second clock signals CLK1 and CLK2 at least once.

The operating process of the stage will be described. First, the tenth and twelfth transistors M10 and M12 are set to be in a turn-on state by the first control signal CS1. Since the second control signal CS2 is not supplied, the eleventh and thirteenth transistors M11 and M13 are set to be in a turn-off state.

Then, the first start signal FLM1 (high voltage) and the second start signal FLM2 (low voltage) are supplied. The first start signal FLM1 supplied to the first input terminal 31 is supplied to the fifth node N5 via the tenth transistor M10. In this case, the voltage of the fifth node N5 is set as a high voltage, and accordingly, the sixth transistor M6 is turned off. The second start signal FLM2 supplied to the second input terminal 32 is supplied to the sixth node N6 via the twelfth transistor M12, and accordingly, the voltage of the sixth node N6 is set as a low voltage.

At time T1, the first clock signal CLK1 is supplied to the third input terminal 33. When the first clock signal CLK1 is supplied, the seventh, eighth and ninth transistors M7, M8 and M9 are turned on.

When the seventh transistor M7 is turned on, the fifth and second nodes N5 and N2 are electrically coupled to each other, and accordingly, the voltage of the second node N2 is set as a high voltage. When the voltage of the second node N2 is set as the high voltage, the second transistor M2 is set to be in a turn-off state.

When the eighth transistor M8 is turned on, the sixth and first nodes N6 and N1 are electrically coupled to each other, and accordingly, the voltage of the first node N1 is set as a low voltage. When the voltage of the first node N1 is set as the low voltage, the first and fifth transistors M1 and M5 are turned on. When the first transistor M1 is turned on, the voltage of the first power source VDD, or emission control signal, is output to the output terminal 38. When the fifth transistor M5 is turned on, the voltage of the first power source VDD is supplied to the second node N2.

When the ninth transistor M9 is turned on, the sixth and fourth nodes N6 and N4 are electrically coupled to each other, and accordingly, the voltage of the fourth node N4 is set as a low voltage. If the voltage of the fourth node N4 is set as the low voltage, the fourth transistor M4 is turned on so that the voltage of the second power source VSS is supplied to the third node N3. Here, the voltage supplied to the third node N3 is supplied as the sampling signal SR1 to the next stage (and the previous stage).

Meanwhile, the low voltage supplied to the fourth node N4 is set as a voltage higher than the voltage of the second start signal FLM2 by the threshold voltage of the transistors, or by other means. Therefore, the voltage supplied to the third node N3 is set as a voltage that is sufficient to turn on the transistors but is slightly higher than the voltage of the second power source VSS.

At time T2, the second clock signal CLK2 is supplied to the fourth input terminal 34. When the second clock signal CLK2 is supplied to the fourth input terminal 34, the voltage of the fourth node N4 drops via the third capacitor C3. When voltage of the fourth node N4 drops, the fourth transistor M4 is completely turned on, and accordingly, the voltage of the second power source VSS is supplied to the third node N3.

Then, the supply of the first and second start signals FLM1 and FLM2 stops. When the supply of the first start signal FLM1 stops, a low voltage is supplied to the first input terminal 31. When the supply of the second start signal FLM2 stops, a high voltage is supplied to the second input terminal 32. The low voltage supplied to the first input terminal 31 is supplied to the fifth node N5, and accordingly, the sixth transistor M6 is turned on. When the sixth transistor M6 is turned on, the voltage of the first power source VDD is supplied to the fourth node N4, and accordingly, the fourth transistor M4 is turned off. When the fourth transistor M4 is turned off, the third node N3 is set to be in a floating state. In this case, the voltage of the third node N3 is maintained as the previous voltage (i.e., a low voltage) by parasitic capacitance, or the like.

At time T3, the first clock signal CLK1 is supplied to the third input terminal 33. When the first clock signal CLK1 is supplied, the seventh, eighth and ninth transistors M7, M8 and M9 are turned on.

When the seventh transistor M7 is turned on, the fifth and second nodes N5 and N2 are electrically coupled to each other, and accordingly, the voltage of the second node N2 is set as a low voltage. When the voltage of the second node N2 is set as the low voltage, the second transistor M2 is turned on, and accordingly, the second power source VSS is supplied to the output terminal 38. When the second power source VSS is supplied to the output terminal 38, the supply of the emission control signal is stopped to the emission control line E1.

When the eighth transistor M8 is turned on, the sixth and first nodes N6 and N1 are electrically coupled to each other, and accordingly, the voltage of the first node N1 is set as a high voltage. When the voltage of the first node N1 is set as the high voltage, the first and fifth transistors M1 and M5 are turned off. If the ninth transistor M9 is turned on, the sixth and fourth nodes N6 and N4 are electrically coupled to each other, and accordingly, the voltage of the fourth node N4 is set as a high voltage.

Meanwhile, the low voltage supplied to the second node N2 is set as a voltage higher than that supplied to the first input terminal 31 by the threshold voltage of the transistors, or the like. In this case, the voltage supplied to the output terminal 38 is set as a voltage slightly higher than that of the second power source VSS.

The second clock signal CLK2 is supplied to the fourth terminal 34 at a fourth time T4. When the second clock signal CLK2 is supplied to the fourth input terminal 34, the voltage of the second node N2 drops via the second capacitor C2. When the voltage of the second node N2 drops, the second transistor M2 is completely turned on, and accordingly, the voltage of the second power source VSS is supplied to the output terminal 38.

The stage described herein supplies an emission control signal to the emission control lines E1 to En while repeating the process described above. Meanwhile, only the four signals in the frame period, i.e., the first clock signal CLK1, the second clock signal CLK2, the first start signal FLM1 and the second start signal FLM2 are changed among the signals supplied to the stage as described herein. If only these signals are changed among all the signals supplied to the stage as described above, the mounting area of the stage can be minimized when the stage is mounted. Additionally, the voltage of the second power source VSS can be output to the emission control line without any voltage loss, and accordingly, power consumption is reduced.

Figure 5:
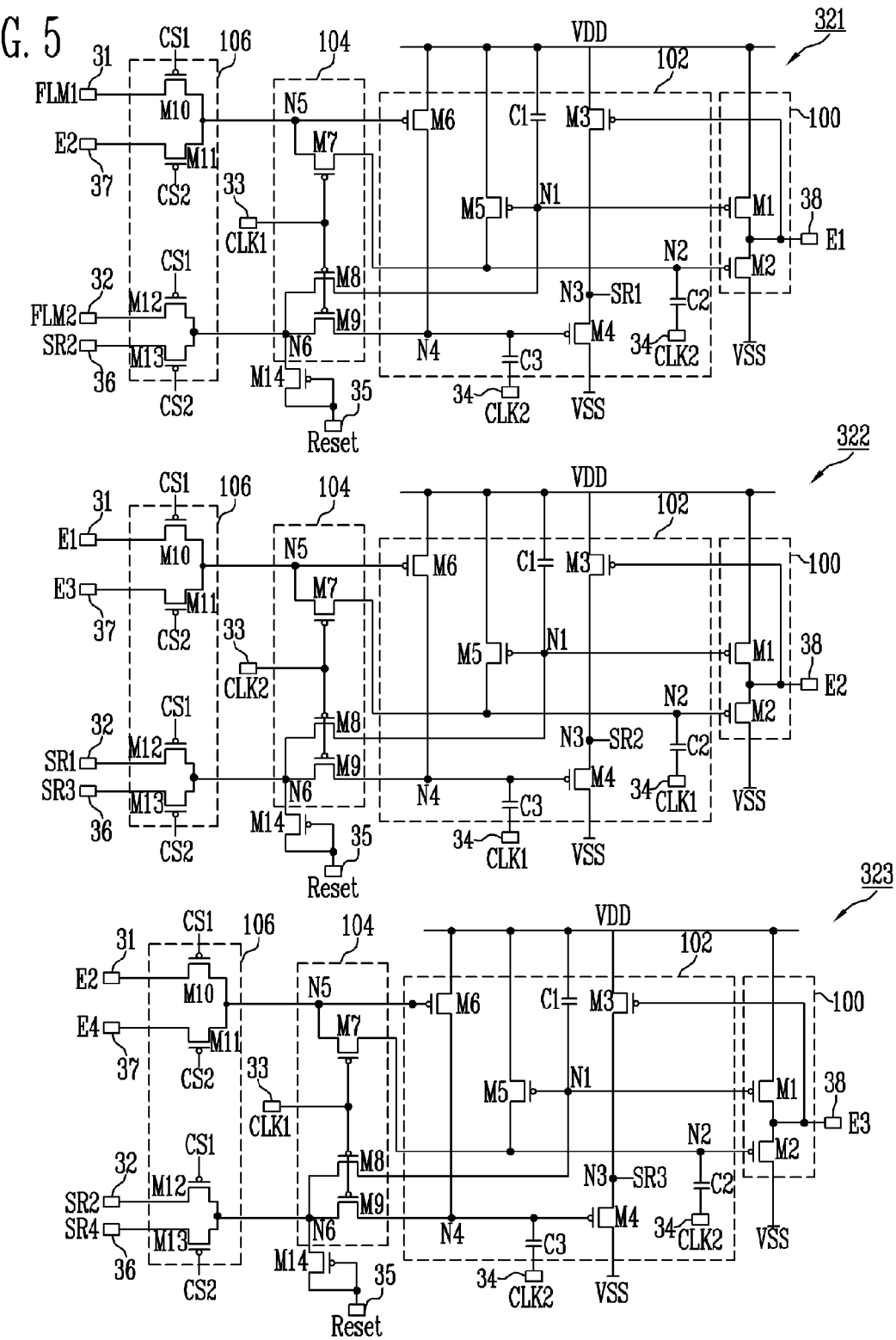
FIG. 5 a circuit diagram illustrating an embodiment of connection of the stages.

FIG. 5 a circuit diagram illustrating an embodiment of connection of the stages as described herein.

Referring to FIG. 5, the third and fourth input terminals 33 and 34 included in the k-th stage (e.g., 321, 322, 323, or 324) receive the first and second clock signals CLK1 and CLK2, respectively. The third and fourth input terminals 33 and 34 included in the (k+1)-th stage receive the second and first clock signals CLK2 and CLK1, respectively.

The first input terminal 31 of each of the stages 321, 322, . . . receives the emission control signal of the previous stage or the first start signal FLM1, and the second input terminal 32 of each of the stages 321, 322, . . . receives the sampling signal of the previous stage or the second start signal FLM2. The seventh input terminal 37 of each of the stages 321, 322, . . . receives the emission control signal of the subsequent stage, and the sixth input terminal 36 of each of the stages 321, 322, . . . receives the sampling signal SR of the subsequent stage.

The stages sequentially supply emission control signals in either the first or second direction, corresponding to the control signals CS1 and CS2. Here, the width of the emission control signal is determined based on the width of each of the start signals FLM1 and FLM2. In a case where the plurality of start signals FLM1 and FLM2 are supplied during one frame period, the emission control signal is also supplied to the emission control line an identical number of times as the start signals are supplied.

Figure 6:
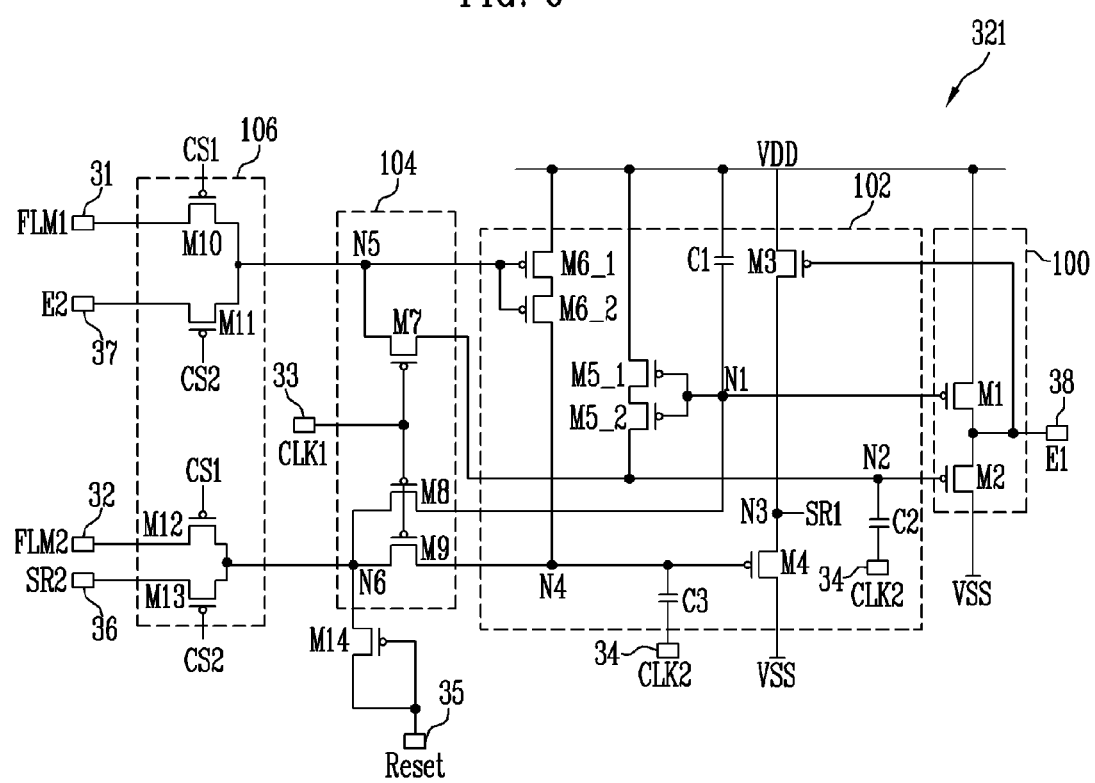
FIG. 6 is a circuit diagram illustrating a second embodiment of the stage shown in FIG. 2.

FIG. 6 is a circuit diagram illustrating a second embodiment of the stage shown in FIG. 2. In description of FIG. 6, components identical to those of FIG. 3 are designated by like reference numerals, and may operate as described elsewhere herein, thus, their detailed descriptions are omitted.

Referring to FIG. 6, in the stage 321 according to the second embodiment, each of the fifth and sixth transistors M5 and M6 is formed by coupling a plurality of transistors in series to each other.

In some embodiments, the fifth transistor M5 is formed by coupling a plurality of transistors, e.g., M5-1 and M5-2 in series to each other between the first power source VDD and the second node N2. In this case, the leakage current flowing from the first power source VDD to the second node N2 is minimized, thereby reducing power consumption.

In some embodiments, the sixth transistor M6 is formed by coupling a plurality of transistors, e.g., M6-1 and M6-2 in series to each other between the first power source VDD and the fourth node N4. In this case, the leakage current flowing from the first power source VDD to the fourth node N42 is minimized, thereby reducing power consumption.

Figure 7:
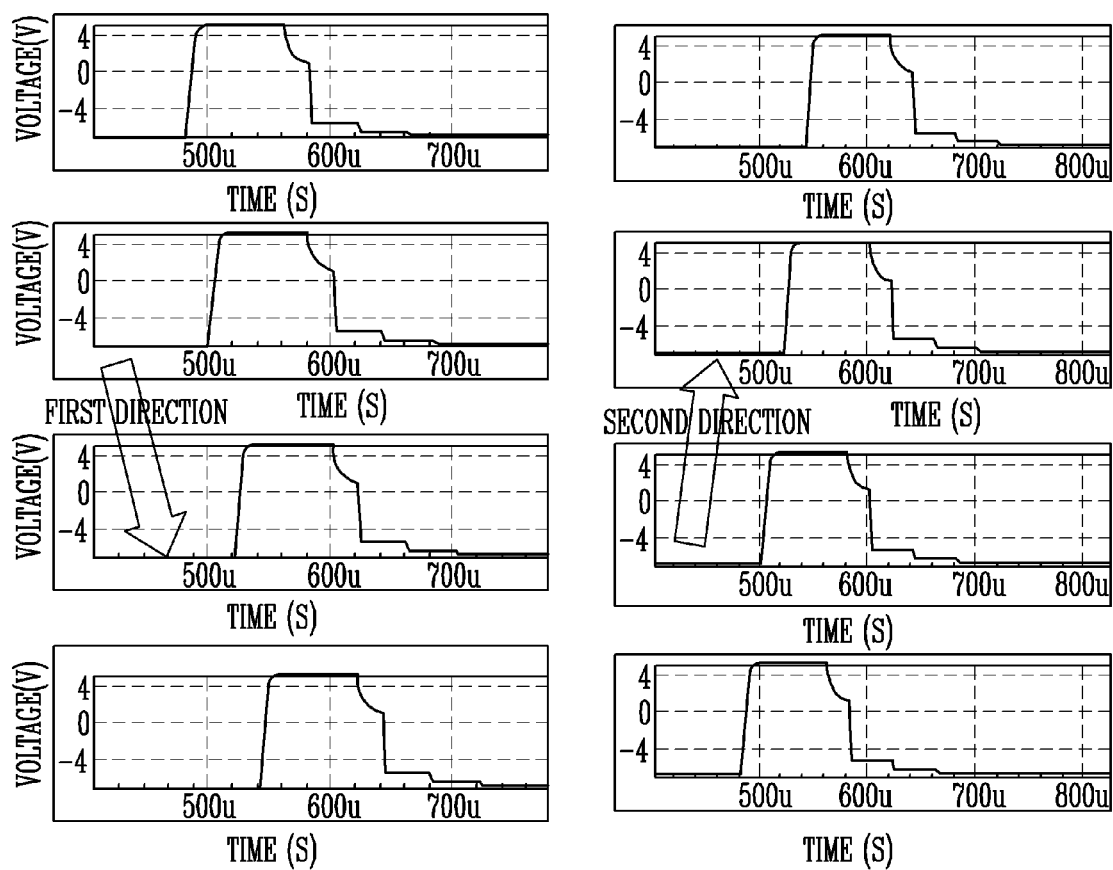
FIG. 7 is a graph illustrating a first simulation result of an emission control driver.

FIG. 7 is a graph illustrating a first simulation result of an emission control driver.

Referring to FIG. 7, the emission control driver supplies an emission control signal in the first or second direction, corresponding to the presence of supply of the first and second control signals CS1 and CS2. That is, the emission control driver 30 supplies the first or second control signal CS1 or CS2, corresponding to the driving method, so that it is possible to control the supply direction of the emission control signal.

Figure 8:
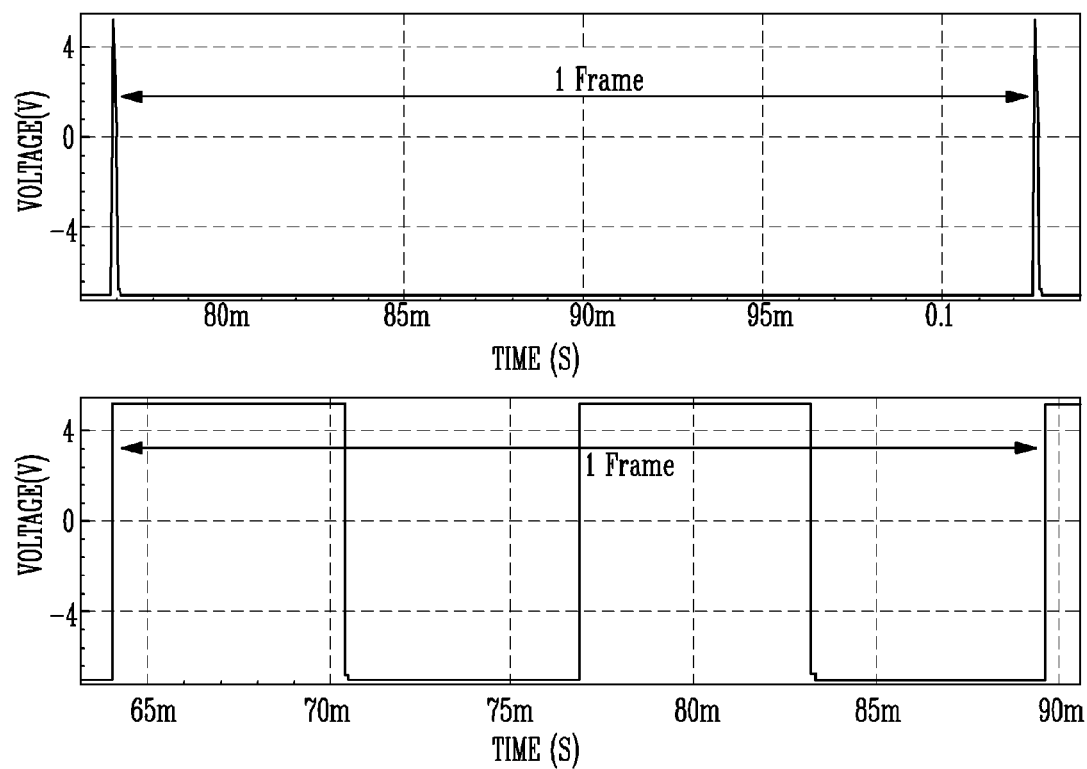
FIG. 8 is a graph illustrating a second simulation result of the emission control driver.

FIG. 8 is a graph illustrating a second simulation result of the emission control driver.

Referring to FIG. 8, the emission control driver 30 according to this embodiment controls the supply number and width of emission control signals, corresponding to the supply number and width of the start signals FLM1 and FLM2. That is, the emission control driver 30 according to this embodiment can control the supply number and width of emission control signals by controlling the supply number and width of the start signals FLM1 and FLM2, corresponding to the driving method.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A stage circuit comprising:
   an output unit configured to supply a first or second power source to an output terminal corresponding to a voltage applied to a first and a second node;
   a bidirectional driver configured to supply signals to a fifth and a sixth node via either a first and a second input terminal or a seventh and sixth input terminal a first driver configured to control the coupling between the fifth and second nodes and the coupling between the sixth and first nodes, according to a first clock signal supplied to a third input terminal; and
   a second driver coupled between the first driver and the output unit configured to output a sampling signal to a third node, according to a voltage supplied from a fourth node,
   wherein the second driver is configured to control the output unit to output the second power to the output terminal without any voltage loss, according to a second clock signal supplied to a fourth input terminal.

2. The stage circuit according to claim 1, wherein the output unit comprises:
   a first transistor coupled between the first power source and the output terminal, having a gate electrode coupled to the first node; and
   a second transistor coupled between the output terminal and the second power source, having a gate electrode coupled to the second node.

3. The stage circuit according to claim 1, wherein the second driver comprises:
   a third transistor coupled between the first power source and the third node, having a gate electrode coupled to the output terminal;

a fourth transistor coupled between the third node and the second power, having a gate electrode coupled to the fourth node;

a fifth transistor coupled between the first power and the second node, having a gate electrode coupled to the first node;

a sixth transistor coupled between the first power and the fourth node, having a gate electrode coupled to the fifth node;

a first capacitor coupled between the first node and the first power source;

a second capacitor coupled between the second node and the fourth input terminal; and a third capacitor coupled between the fourth node and the fourth input terminal.

4. The stage circuit according to claim 3, wherein each of the fifth and sixth transistors is formed by coupling a plurality of transistors in series.

5. The stage circuit according to claim 1, wherein the first driver comprises:

a seventh transistor coupled between the fifth node and the second node, having a gate electrode coupled to the third input terminal;

an eighth transistor coupled between the sixth node and the first node, having a gate electrode coupled to the third input terminal; and a ninth transistor coupled between the sixth node and the fourth node, having a gate electrode coupled to the third input terminal.

6. The stage circuit according to claim 1, wherein the bidirectional driver comprises:

a tenth transistor coupled between the first input terminal and the fifth node, configured to be turned on when a first control signal is supplied;

an eleventh transistor coupled between the seventh input terminal and the fifth node, configured to be turned on when a second control signal is supplied;

a twelfth transistor coupled between the second input terminal and the sixth node, configured to be turned on when the first control signal is supplied; and a thirteenth transistor coupled between the sixth input terminal and the sixth node, configured to be turned on when the second control signal is supplied.

7. The stage circuit according to claim 1, further comprising a fourteenth transistor coupled between the sixth node and a fifth input terminal, having a gate electrode coupled to the fifth input terminal.

8. An emission control driver comprising a plurality of stage circuits respectively coupled to a plurality of emission control lines, wherein each of the plurality of stage circuits comprises:

an output unit configured to supply a first or a second power source to an output terminal, according to a voltage at a first and a second node respectively;

a bidirectional driver configured to supply signals supplied to a fifth and a sixth node via either a first and a second input terminal or a seventh and a sixth input terminal respectively;

a first driver configured to control the coupling between the fifth and second nodes and the coupling between the sixth and first nodes, according to a first clock signal supplied to a third input terminal; and a second driver coupled between the second driver and the output unit configured to output a sampling signal to a third node, corresponding to a voltage supplied from a fourth node; and wherein the second driver is configured to control the output unit to output the second power source to the output terminal without any voltage loss, according to a second clock signal supplied to a fourth input terminal.

9. The emission control driver according to claim 8, wherein the third and fourth input terminals of a k-th stage are configured to receive the first and second clock signals, respectively, and the third and fourth input terminals of a (k+1)-th stage are configured to receive the second and first clock signals, respectively.

10. The emission control driver according to claim 8, wherein the first and second clock signals have the same period, and are non-overlapping.

11. The emission control driver according to claim 8, wherein the first input terminal is configured to receive a first start signal or an emission control signal of a previous stage, the second input terminal is configured to receive a second start signal or a sampling signal of the previous stage, the sixth input terminal is configured to receive a sampling signal of a next stage or the second start signal, and the seventh input terminal is configured to receive an emission control signal of the next stage or the first start signal.

12. The emission control driver according to claim 11, wherein the first and second input terminals of a first stage of the plurality of stages receive the first and second start signals, respectively.

13. The emission control driver according to claim 11, wherein the sixth and seventh input terminals of the last stage of the plurality of stages receive the second and first start signals, respectively.

14. The emission control driver according to claim 11, wherein the first and second start signals have the same width, and have opposite phases.

15. The emission control driver according to claim 8, wherein the output unit comprises:

a first transistor coupled between the first power and the output terminal, having a gate electrode coupled to the first node; and a second transistor coupled between the output terminal and the second power, having a gate electrode coupled to the second node.

16. The emission control driver according to claim 8, wherein the first driver comprises:

a third transistor coupled between the first power source and the third node, having a gate electrode coupled to the output terminal;

a fourth transistor coupled between the third node and the second power source, having a gate electrode coupled to the fourth node;

a fifth transistor coupled between the first power source and the second node, having a gate electrode coupled to the first node;

a sixth transistor coupled between the first power source and the fourth node, having a gate electrode coupled to the fifth node;

a first capacitor coupled between the first node and the first power source;

a second capacitor coupled between the second node and the fourth input terminal; and a third capacitor coupled between the fourth node and the fourth input terminal.

17. The emission control driver according to claim 16, wherein each of the fifth and sixth transistors is formed by coupling a plurality of transistors in series.

18. The emission control driver according to claim 8, wherein the second driver comprises:

a seventh transistor coupled between the fifth node and the second node, having a gate electrode coupled to the third input terminal;

an eighth transistor coupled between the sixth node and the first node, having a gate electrode coupled to the third input terminal; and a ninth transistor coupled between the sixth node and the fourth node, having a gate electrode coupled to the third input terminal.

19. The emission control driver according to claim 8, wherein the bidirectional driver comprises:

a tenth transistor coupled between the first input terminal and the fifth node, configured to be turned on when a first control signal is supplied;

an eleventh transistor coupled between the seventh input terminal and the fifth node, configured to be turned on when a second control signal is supplied;

a twelfth transistor coupled between the second input terminal and the sixth node, configured to be turned on when the first control signal is supplied; and a thirteenth transistor coupled between the sixth input terminal and the sixth node, configured to be turned on when the second control signal is supplied.

20. The emission control driver according to claim 19, wherein the emission control signal is sequentially supplied to the plurality of emission control lines in a first direction when the first control signal is supplied, and the emission control signal is sequentially supplied to the plurality of emission control lines in a second direction when the second control signal is supplied.

21. The emission control driver according to claim 8, further comprising a fourteenth transistor coupled between the sixth node and a fifth input terminal, having a gate electrode coupled to the fifth input terminal.

22. The emission control driver according to claim 21, wherein the fifth input terminal is configured to receives a reset signal such that the emission control signal is simultaneously supplied to each of the plurality of emission control lines.

* * * * *